United States Patent
Kubota et al.

(10) Patent No.: US 9,923,360 B2
(45) Date of Patent: Mar. 20, 2018

(54) ELECTRONIC APPARATUS, POWER SUPPLY DEVICE, AND POWER SUPPLY MONITORING METHOD

(71) Applicant: FUJITSU LIMITED, Kawasaki-shi, Kanagawa (JP)

(72) Inventors: Ryo Kubota, Kita (JP); Hiroki Tashima, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 225 days.

(21) Appl. No.: 14/815,147

(22) Filed: Jul. 31, 2015

(65) Prior Publication Data
US 2016/0094023 A1    Mar. 31, 2016

(30) Foreign Application Priority Data
Sep. 25, 2014 (JP) .................... 2014-194637

(51) Int. Cl.
| H02H 3/08 | (2006.01) |
|---|---|
| H02H 3/087 | (2006.01) |
| H02H 9/02 | (2006.01) |
| H02H 3/10 | (2006.01) |
| G01R 31/02 | (2006.01) |
| H02M 1/32 | (2007.01) |
| G06F 1/28 | (2006.01) |

(52) U.S. Cl.
CPC .......... H02H 3/081 (2013.01); G01R 31/02 (2013.01); G06F 1/28 (2013.01); H02M 1/32 (2013.01)

(58) Field of Classification Search
CPC .......... H02H 3/081; H02H 3/08; H02H 3/087; H02H 9/02; G06F 1/28; G01R 31/02

USPC .................................... 361/93.1, 86
See application file for complete search history.

(56) References Cited

U.S. PATENT DOCUMENTS

| 2005/0035656 A1 | 2/2005 | Kuramochi et al. |
|---|---|---|
| 2007/0029979 A1* | 2/2007 | Williams .......... G05F 1/66 323/217 |

FOREIGN PATENT DOCUMENTS

| JP | 2004-338577 | 12/2004 |
|---|---|---|
| JP | 2005-140642 | 6/2005 |
| JP | 2006-271069 | 10/2006 |
| JP | 2010-88254 | 4/2010 |

OTHER PUBLICATIONS

Japanese Office Action dated Jan. 30, 2019 from Japanese Patent Application No. 2014-194637, 8 pages.

* cited by examiner

*Primary Examiner* — Dharti Patel
(74) *Attorney, Agent, or Firm* — Staas & Halsey LLP (57) ABSTRACT

An electronic apparatus includes: a power supply circuit that supplies power supply voltage to a load; an overcurrent detection circuit that performs output of detection information indicating the direction of current at a power supply path for the load in the power supply circuit when overcurrent occurs in the power supply path; and a determination circuit that performs output of notification information indicating whether or not a location at which a failure occurs exists within the power supply circuit or outside the power supply circuit, based on the detection information.

9 Claims, 11 Drawing Sheets

ELECTRONIC APPARATUS, POWER SUPPLY DEVICE, AND POWER SUPPLY MONITORING METHOD

CROSS-REFERENCE TO RELATED APPLICATION

This application is based upon and claims the benefit of priority of the prior Japanese Patent Application No. 2014-194637, filed on Sep. 25, 2014, the entire contents of which are incorporated herein by reference.

FIELD

The embodiments discussed herein are related to an electronic apparatus, a power supply device, and a power supply monitoring method.

BACKGROUND

Among power supply circuits each of which supplies power to a load, there is a power supply circuit including a function to detect overcurrent caused by an electric short-circuit or the like on a power supply path. For example, a parallel multiple chopper device has been proposed in which current is detected on the output side of a plurality of switching elements, and all of the switching elements are turned off when output current of any one of the switching elements exceeds a certain threshold value.

In addition, as an example of a technology related to a power supply circuit, a power supply system has been proposed in which, except a case in which a drooping characteristic appears in output voltage, it is determined that a failure occurs in a power supply unit when the output voltage falls below a rated voltage. Japanese Laid-open Patent Publication No. 2006-271069 and Japanese Laid-open Patent Publication No. 2010-88254 are the related arts.

An electric short-circuit on a power supply path may occur even inside the power supply circuit or on the load side, so that it is difficult to determine whether or not the cause location is inside the power supply circuit even when the power supply circuit detects occurrence of overcurrent. Therefore, there is a problem that it takes a long time to identify and replace a device in which a failure has occurred, and recover the operation.

An object of an embodiment is to provide an electronic apparatus, a power supply device, and a power supply monitoring method in which a recovery work from the occurrence of the overcurrent is streamlined.

SUMMARY

According to an aspect of the invention, an electronic apparatus includes: a power supply circuit that supplies power supply voltage to a load; an overcurrent detection circuit that performs output of detection information indicating the direction of current at a power supply path for the load in the power supply circuit when overcurrent occurs in the power supply path; and a determination circuit that performs output of notification information indicating whether or not a location at which a failure occurs exists within the power supply circuit or outside the power supply circuit, based on the detection information.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS (First Embodiment)

Figure 1:
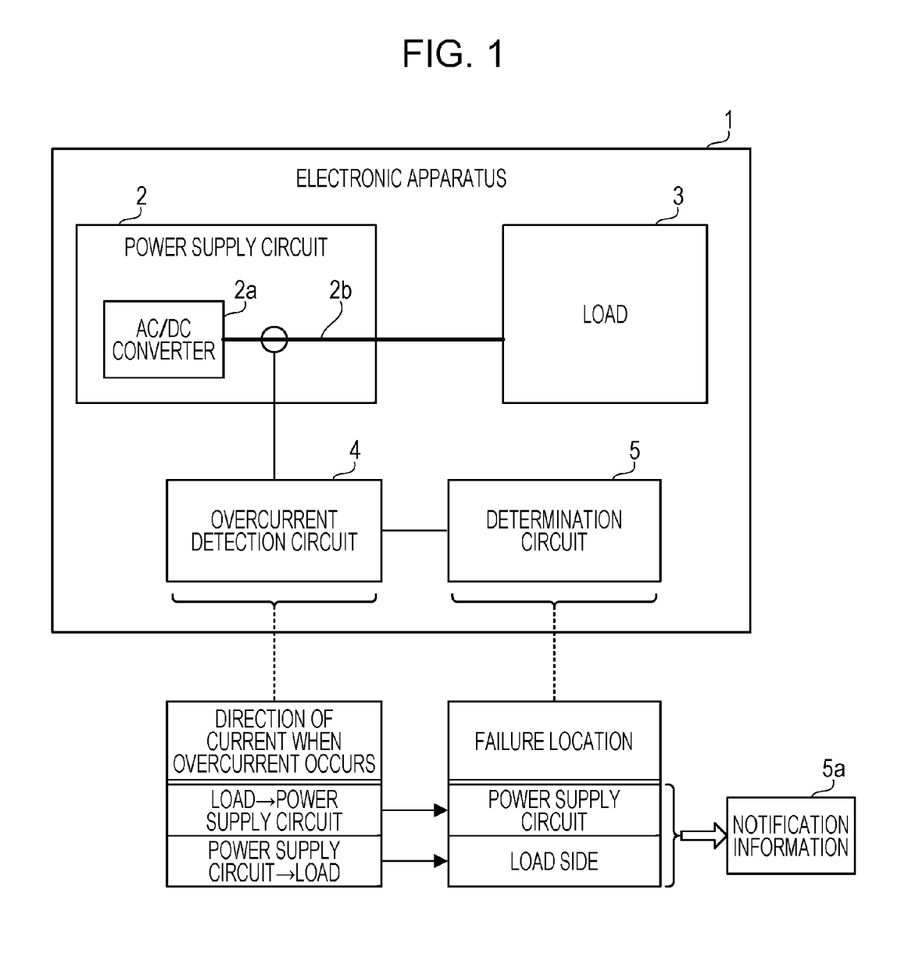
FIG. 1 is a diagram illustrating a configuration example and an operation example of an electronic apparatus according to a first embodiment.

Embodiments are described below with reference to drawings. FIG. 1 is a diagram illustrating a configuration example and an operation example of an electronic apparatus according to a first embodiment. An electronic apparatus 1 includes a power supply circuit 2, a load 3, an overcurrent detection circuit 4, and a determination circuit 5.

The power supply circuit 2 supplies power supply voltage to the load 3. The power supply circuit 2 includes, for example, an alternating current/direct current (AC/DC) converter 2a, and the power supply voltage that has been output from the AC/DC converter 2a through a transmission line 2b is supplied to the load 3. The load 3 is operated using the power supply voltage that has been supplied from the power supply circuit 2. The load 3 may be provided outside the electronic apparatus 1.

When overcurrent has occurred in the power supply path for the load 3 in the power supply circuit 2, the overcurrent detection circuit 4 detects direction of current in the power supply path. In addition, the overcurrent detection circuit 4 performs output of detection information indicating the detected direction of current. In the example of FIG. 1, the overcurrent detection circuit 4 detects the direction of the current at the time of occurrence of the overcurrent, in the transmission line 2b of the power supply circuit 2.

The determination circuit 5 determines whether or not a location at which a failure has occurred exists in the power supply circuit 2, based on the detection information that has been output from the overcurrent detection circuit 4. In addition, the determination circuit 5 performs output of notification information 5a indicating whether or not the location at which the failure has occurred exists in the power supply circuit 2.

For example, when the direction of the current is a direction from the load 3 to the power supply circuit 2, notification of information indicating that the location at which the failure has occurred exists in the power supply circuit 2 is performed. On the other hand, when the direction of the current is a direction from the power supply circuit 2 to the load 3, notification of information indicating that the location at which the failure has occurred does not exist in the power supply circuit 2 but exists in the load 3 side is performed. Needless to say but, in case the supply voltage is negative, the relationship between the direction of the current and the location at which the failure has occurred should be opposite to the above-mentioned.

As described above, the electronic apparatus 1 may determine whether or not the location at which a failure has occurred when overcurrent is caused exists in the power supply circuit 2, from the direction of the current, which has been detected when the overcurrent is caused in the power supply circuit 2, and perform output of the notification information 5a indicating the determination result. As a result, an administrator of the electronic apparatus 1 may identify a device in which the failure has occurred, from the notification information 5a, and replace the device. Thus, a recovery work after the overcurrent has occurred may be performed efficiently.

(Second Embodiment)

Figure 2:
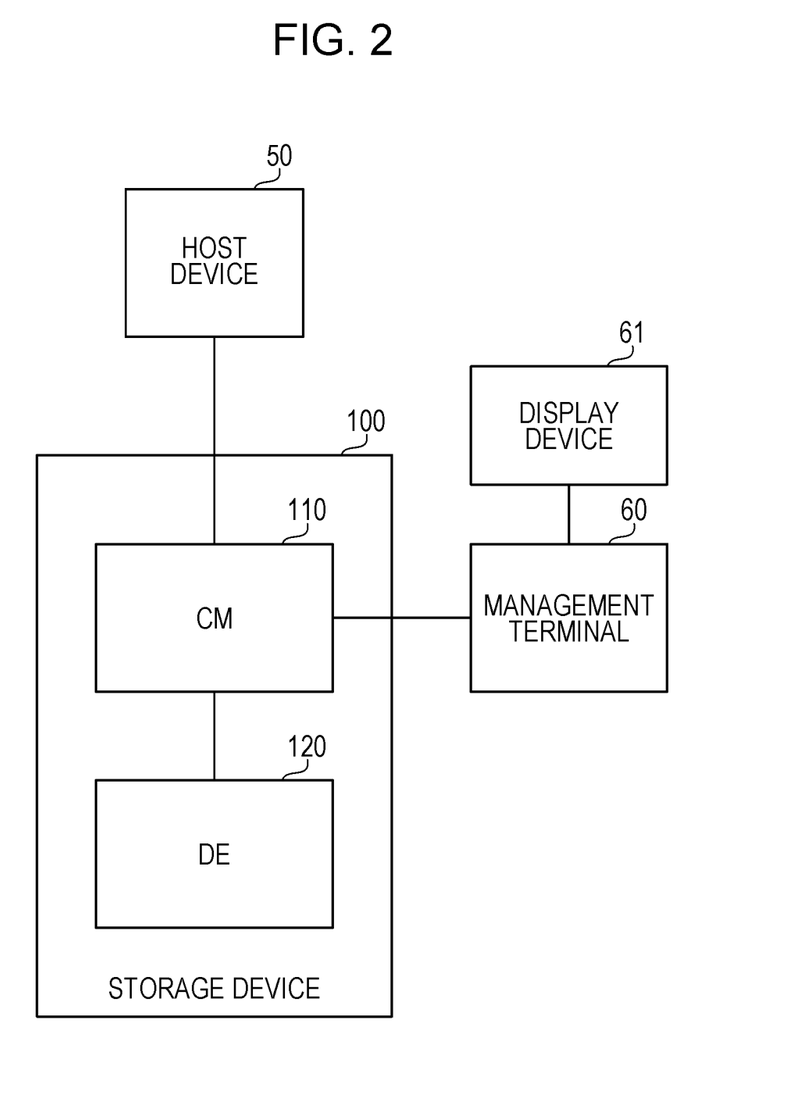
FIG. 2 is a diagram illustrating a system configuration example of a storage system according to a second embodiment.

As an example of a system including the above-described electronic apparatus 1, a storage system is described below. FIG. 2 is a diagram illustrating a system configuration example of a storage system according to a second embodiment. The storage system illustrated in FIG. 2 includes a storage device 100 and a host device 50. The storage device 100 is coupled to the host device 50, for example, through a fiber channel (FC) network. The host device 50 requests the storage device 100 to access a storage device installed in the storage device 100.

The storage device 100 includes a controller module (CM) 110 and a drive enclosure (DE) 120. The CM 110 is coupled to the DE 120, for example, through a serial attached small computer system interface (SCSI) (SAS) cable. The DE 120 includes a plurality of hard disk drives (HDD), as storage devices that are access destinations from the host device 50. The CM 110 controls an access to the HDD in the DE 120, in response to the access request from the host device 50.

In addition, the management terminal 60 is coupled to the CM 110, for example, through a local area network (LAN) cable. A display device 61 is coupled to the management terminal 60. The administrator may perform various setting operations for the storage device 100, for example, by operating the management terminal 60. In addition, for example, when a failure has been detected in the storage device 100, notification information is transmitted from the CM 110 to the management terminal 60. The administrator may take desired measures by recognizing a content of the notification information through the display device 61.

Figure 3:
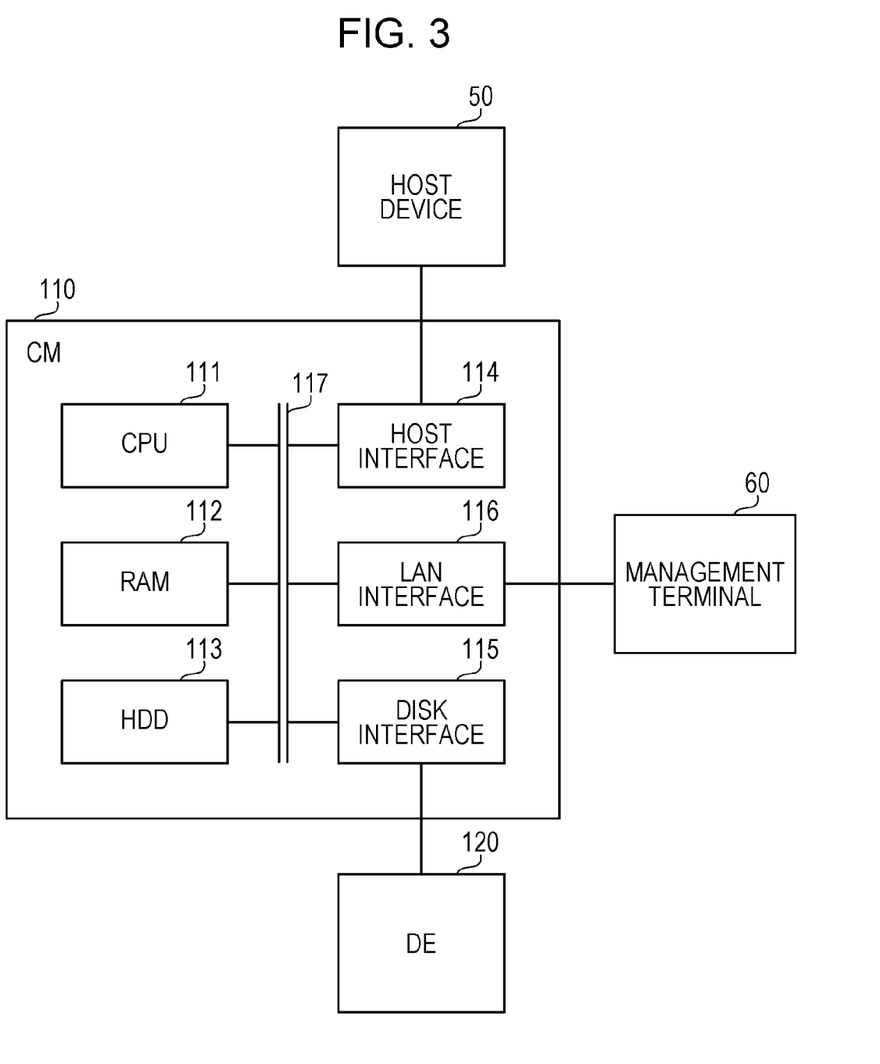
FIG. 3 is a diagram illustrating a hardware configuration example of a CM.

In FIG. 2, the DE 120 is an example of the electronic apparatus 1 illustrated in FIG. 1. FIG. 3 is a diagram illustrating a hardware configuration example of the CM. The entire CM 110 is controlled by a central processing unit (CPU) 111. One or a plurality of processor cores is included in the CPU 111.

In addition, a random access memory (RAM) 112 used as a main storage device of the CM 110 is coupled to the CPU 111. At least a part of an operating system (OS) program and a firmware program that the CPU 111 is caused to execute is temporarily stored in the RAM 112. In addition, various pieces of data desired for processing executed by the CPU 111 are stored in the RAM 112.

In addition, an HDD 113, a host interface 114, a disk interface (DI) 115 and a LAN interface 116 are coupled to the CPU 111 through a bus 117.

The HDD 113 is used as a secondary storage device of the CM 110 and stores a program executed by the CPU 111, various pieces of data desired for the execution. As the secondary storage device, for example, a further type of a nonvolatile storage device such as a solid state drive (SSD) may be used.

The host interface 114 is used to execute interface processing in which data is transmitted and received between the host device 50 and the CPU 111. The DI 115 is used to execute interface processing in which data is transmitted and received between the CPU 111 and the various devices such as the HDD in the DE 120. The LAN interface 116 is used to execute interface processing in which data is transmitted and received to and from the management terminal 60, through a LAN cable.

Similar to the CM 110, the host device 50 and the management terminal 60 may be achieved as a computer device the whole of which is controlled so that the CPU is caused to execute the program stored in the RAM.

Figure 4:
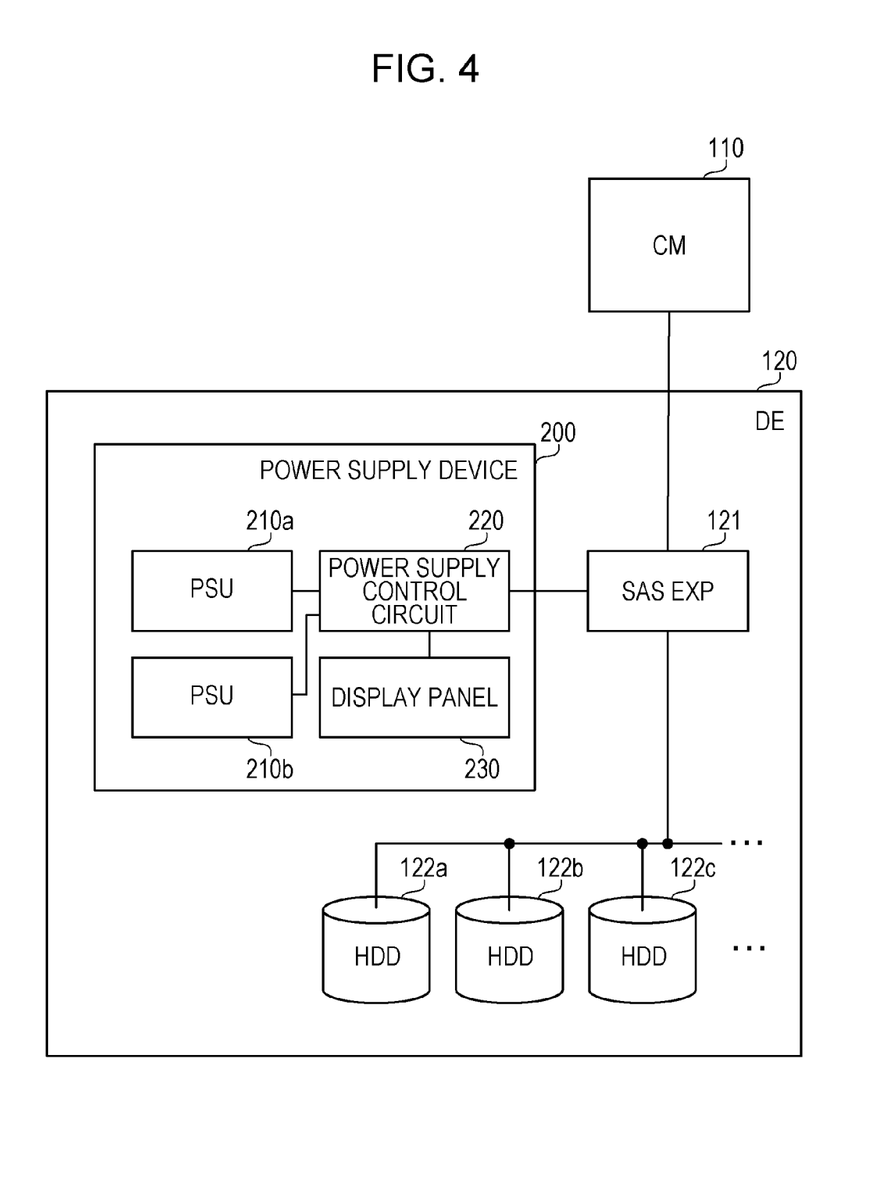
FIG. 4 is a diagram illustrating a hardware configuration example of a DE.

FIG. 4 is a diagram illustrating a hardware configuration example of the DE. The DE 120 includes an SAS expander 121, HDDs 122a, 122b, 122c, . . . , and a power supply device 200.

The CM 110, the HDDs 122a, 122b, 122c, . . . , and the power supply device 200 are coupled to the SAS expander 121. The SAS expander 121 relays data transmitted and received between the CM 110, the HDDs 122a, 122b, 122c, . . . , and the power supply device 200.

The HDDs 122a, 122b, 122c, . . . are storage devices that are access targets from the host device 50. The number of HDDs that are access targets, which are installed in the DE 120, is not particularly limited. In addition, as the storage device that is the access target, for example, an SSD may be used.

The power supply device 200 includes power supply units (PSUs) 210a and 210b, a power supply control circuit 220, and a display panel 230. The power supply device 200 is obtained, for example, by a module in which the PSUs 210a and 210b, the power supply control circuit 220, and the display panel 230 are installed on a printed board.

The PSUs 210a and 210b are power supply circuits that supply power to the units in the DE 120. Typically, both of the PSUs 210a and 210b are operated, and the operation of the DE 120 may be continued by the power supply voltage output from one of the PSUs even when the other PSU is stopped due to a failure. Therefore, failure tolerance is improved due to redundancy of the PSUs. In the power supply device 200, three or more systems of PSUs may be installed.

The power supply control circuit 220 monitors the operations of the PSUs 210a and 210b, and determines the presence or absence of occurrence of a failure. When the power supply control circuit 220 detects occurrence of a failure, the power supply control circuit 220 may transmit notification information indicating a content of the failure, to the CM 110, through the SAS expander 121. In this case, the notification information is transmitted from the CM 110 to the management terminal 60, and displayed, for example, on the display device 61. In addition, the power supply control circuit 220 may also cause the display panel 230 to display the content of the failure.

The display panel 230 may be obtained, for example, by a liquid crystal display device. The display surface of the display panel 230 is exposed on the housing surface of the DE 120, and is allowed to be recognized visually by the user. Information specified by the power supply control circuit 220 is displayed on the display panel 230. As described later, the display panel 230 is operated using not the main power supply voltage but standby power supply voltage that is lower than the main power supply voltage. Therefore, it is desirable that the display panel 230 is a display device the electric power consumption of which is low. The display panel 230 may be obtained, for example, by an emission lamp using a light emitting diode (LED) or the like, in addition to the liquid crystal display device.

Figure 5:
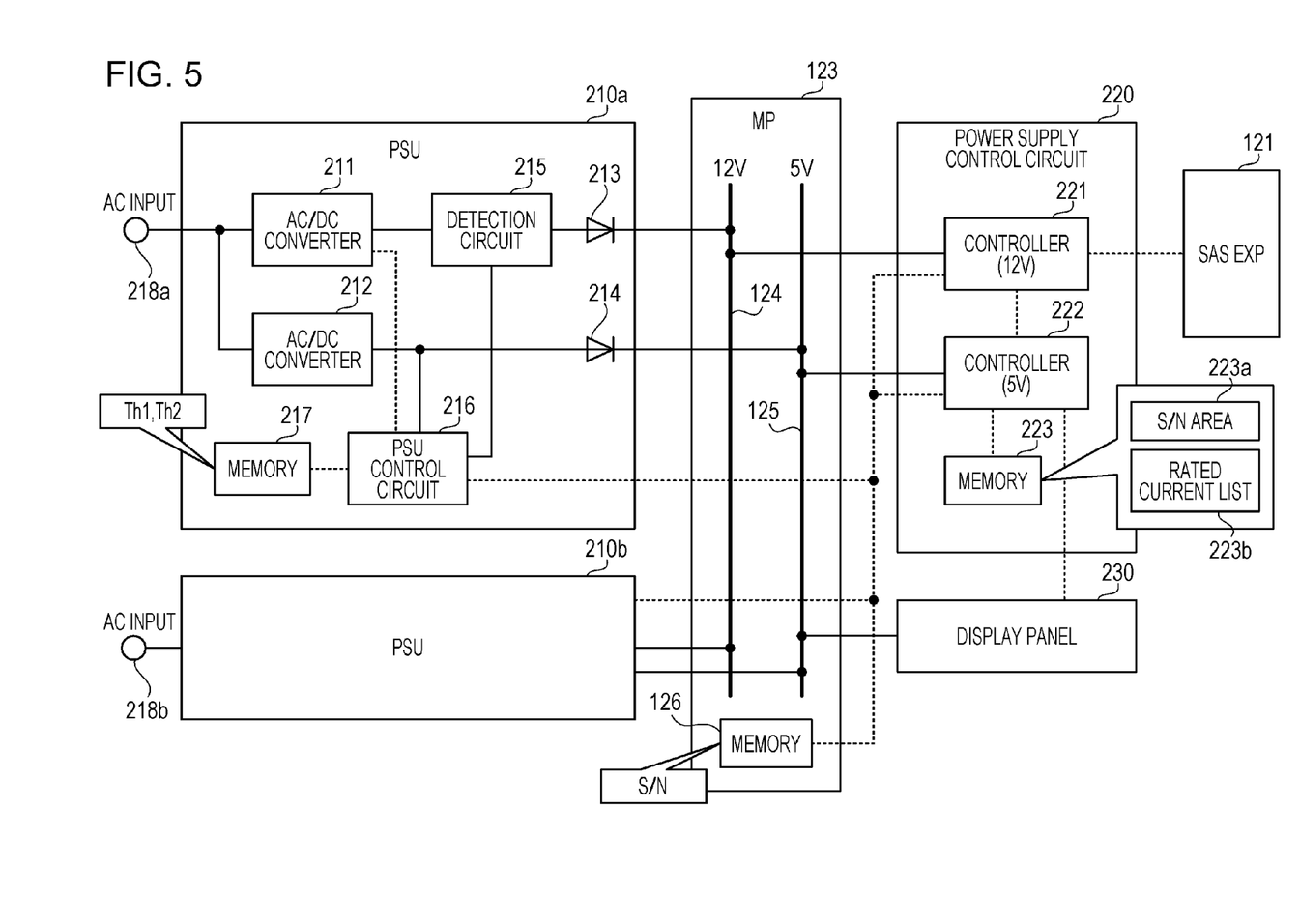
FIG. 5 is a diagram illustrating an internal configuration example of a power supply device of the DE.

FIG. 5 is a diagram illustrating an internal configuration example of the power supply device of the DE. In FIG. 5, in addition to the configuration elements of the power supply device 200, a middle plane (MP) 123 installed in the DE 120 is also illustrated. The MP 123 is a printed board in which power supply lines 124 and 125 are formed that are used to supply power supply voltage output from the PSUs 210a and 210b to the devices in the DE 120. The power supply line 124 performs transmission of 12V power supply voltage that is the main power supply voltage, and the power supply line 125 performs transmission of 5V power supply voltage that is the standby power supply voltage.

In addition, a nonvolatile memory 126 is installed in the MP 123. A serial number (S/N) of the MP 123 is stored in the memory 126 in advance. Here, the serial number is a number such as a manufacturing number individually assigned to a product having the same model of an MP.

The PSU 210a includes AC/DC converters 211 and 212, diodes 213 and 214, a detection circuit 215, a PSU control circuit 216, and a memory 217. The AC/DC converter 211 converts AC voltage supplied from an input terminal 218a into DC voltage of 12 V, and performs output of the DC voltage. The 12V power supply voltage output from the AC/DC converter 211 is output to the power supply line 124 of the MP 123 through the detection circuit 215 and the diode 213, and supplied to each of the devices in the DE 120 as the main power supply voltage.

The AC/DC converter 212 converts AC voltage supplied from the input terminal 218a into DC voltage of 5 V, and performs output of the DC voltage. The 5V power supply voltage output from the AC/DC converter 212 is supplied to the PSU control circuit 216 while being output to the power supply line 125 of the MP 123 through the diode 214.

Here, start and stop of the operation of the AC/DC converter 211 is controlled by the PSU control circuit 216. On the other hand, the AC/DC converter 212 is constantly operated regardless whether the AC/DC converter 211 is operated, and continues to perform output of 5V power supply voltage. In this regard, the 5V power supply voltage may be referred to as "resident power supply voltage". Even when output of the 12V power supply voltage is stopped, the DE 120 may execute minimum-desired processing such as processing for the time of occurrence of a failure because the 5V power supply voltage is continued to be output.

The anode of the diode 213 is coupled to the detection circuit 215, and the cathode of the diode 213 is coupled to the power supply line 124 of the MP 123. The diode 213 blocks back-flow of current from the power supply line 124 to the AC/DC converter 211. The anode of the diode 214 is coupled to the AC/DC converter 212, and the cathode of the diode 214 is coupled to the power supply line 125 of the MP 123. The diode 214 blocks back-flow of current from the power supply line 125 to the AC/DC converter 212.

The detection circuit 215 includes a circuit group used to detect the amount and the direction of current that flows between the AC/DC converter 211 and the diode 213. An internal configuration example of the detection circuit 215 is described below with reference to FIG. 7.

The PSU control circuit 216 is a circuit used to control the operation of the PSU 210a. The PSU control circuit 216 includes a function to communicate with the power supply control circuit 220 and a function to control the operation of the AC/DC converter 211. In addition, the PSU control circuit 216 detects the following two types of failure occurrence, based on the results of the amount and direction of current, which has been obtained by the detection circuit 215. One of the types of failure occurrence is occurrence of "overcurrent" in which the detected current exceeds a threshold value Th1, and the other type of failure occurrence is occurrence of "specified value exceedance" in which the detected current is the threshold value Th1 or less, but exceeds a threshold value Th2 that is smaller than the threshold value Th1.

These two types of failure occurrence are distinguished depending on a difference of the state in which an electric short-circuit has occurred on a power supply path. When an electric short-circuit has occurred, the location of the electric short-circuit is burnt out, and the state at the location becomes an open state eventually. Here, when it takes a time to some extent until the state at the location of the electric short-circuit becomes the open state after the electric short-circuit has occurred, a great deal of current temporarily flows through the power supply line. Such a state is a state in which overcurrent has occurred. On the other hand, when the state of the location of electric short-circuit becomes the open state within a short time after the electric short-circuit has occurred, the operation of the AC/DC converter 211 may not be stopped in spite of the fact that current that flows through the power supply line is increased temporarily at the time of occurrence of the electric short-circuit. Such a state is a state in which specified value exceedance has occurred.

The location of the electric short-circuit by which the specified value exceedance is caused is not inside the PSU 210a, but on the load side. In addition, the threshold value Th2 is calculated by the power supply control circuit 220, based on rated current of each of the devices installed in the DE 120 and the number of PSUs that are being operated. Such a calculation method is described later.

The PSU control circuit 216 outputs "overcurrent detection notification" indicating occurrence of overcurrent and the direction of current at that time, to the power supply control circuit 220 when it is determined that the detected current exceeds the threshold value Th1, based on the result of the amount and the direction of the current, which have been detected by the detection circuit 215. In addition, the PSU control circuit 216 outputs "specified value exceedance notification" indicating occurrence of specified value exceedance and the direction of current at that time, to the power supply control circuit 220 when it is determined that the detected current is larger than the threshold value Th2 and the threshold value Th1 or less, based on the result of the amount and the direction of the current, which have been detected by the detection circuit 215.

Here, the PSU control circuit 216 is operated using 5V power supply voltage from the AC/DC converter 212. As a result, the operation of the PSU control circuit 216 is continued even when the operation of the AC/DC converter 211 is stopped due to occurrence of a failure, and the output of the 12V power supply voltage is stopped. For example, the PSU control circuit 216 may communicate with the power supply control circuit 220 even when the operation of the AC/DC converter 211 is stopped.

The memory 217 is a nonvolatile storage device, and reading and writing are performed on the memory 217 by the PSU control circuit 216. The above-described threshold values Th1 and Th2 are stored in the memory 217, and the stored threshold values Th1 and Th2 are referred to by the PSU control circuit 216 at the time of detection of a failure. The threshold value Th1 is stored in the memory 217 in advance. On the other hand, the threshold value Th2 is updated as appropriate, in response to an instruction from the power supply control circuit 220. The threshold values Th1 and Th2 may be stored, for example, in a register in the PSU control circuit 216.

The internal configuration of the PSU 210b is similar to the PSU 210a, so that the description is omitted herein. In the following description, a configuration element in the PSU 210b may be described using the corresponding configuration element in the PSU 210a.

The power supply control circuit 220 includes controllers 221 and 222, and a memory 223. The controller 221 is operated using 12V power supply voltage. The controller 221 monitors whether overcurrent notification or specified value exceedance notification is output from the PSU control circuit 216 in each of the PSUs 210. The controller 221 determines a location at which a failure has occurred based on the received content of the overcurrent notification or specified value exceedance notification, and transmits notification information indicating the determination result, to the CM 110 through the SAS expander 121.

The controller 222 is operated using 5V power supply voltage. The controller 222 monitors whether or not that overcurrent notification is output from the PSU control circuit 216 in each of the PSUs 210. The controller 222 causes the display panel 230 to display information indicating that overcurrent has occurred in the MP 123 when overcurrent notification has been received from the PSU control circuits 216 in both of the PSUs 210a and 210b in a state in which supply of the 12V power supply voltage is stopped, and the operation of the controller 221 is stopped. In addition, at this time, the controller 222 reads a serial number of the MP 123 from the memory 126, and records the read serial number to the memory 223.

When overcurrent has been detected in both of the PSUs 210a and 210b, a failure occurs in the MP 123, so that the DE 120 is shut down by the administrator to replace the MP 123. The serial number that has been recorded to the memory 223 is used to determine whether or not the MP 123 has been replaced after restart of the DE 120.

The memory 223 is a nonvolatile storage device. A serial number area 223a is allocated in the memory 223. The serial number area 223a is a storage area in which a serial number of the MP 123 is stored by the controller 222. In addition, a rated current list 223b is stored in the memory 223. Rated current is registered to the rated current list 223b for each of the devices that are to be installed in the DE 120. Processing using the serial number area 223a and the rated current list 223b is described later.

Figure 6:
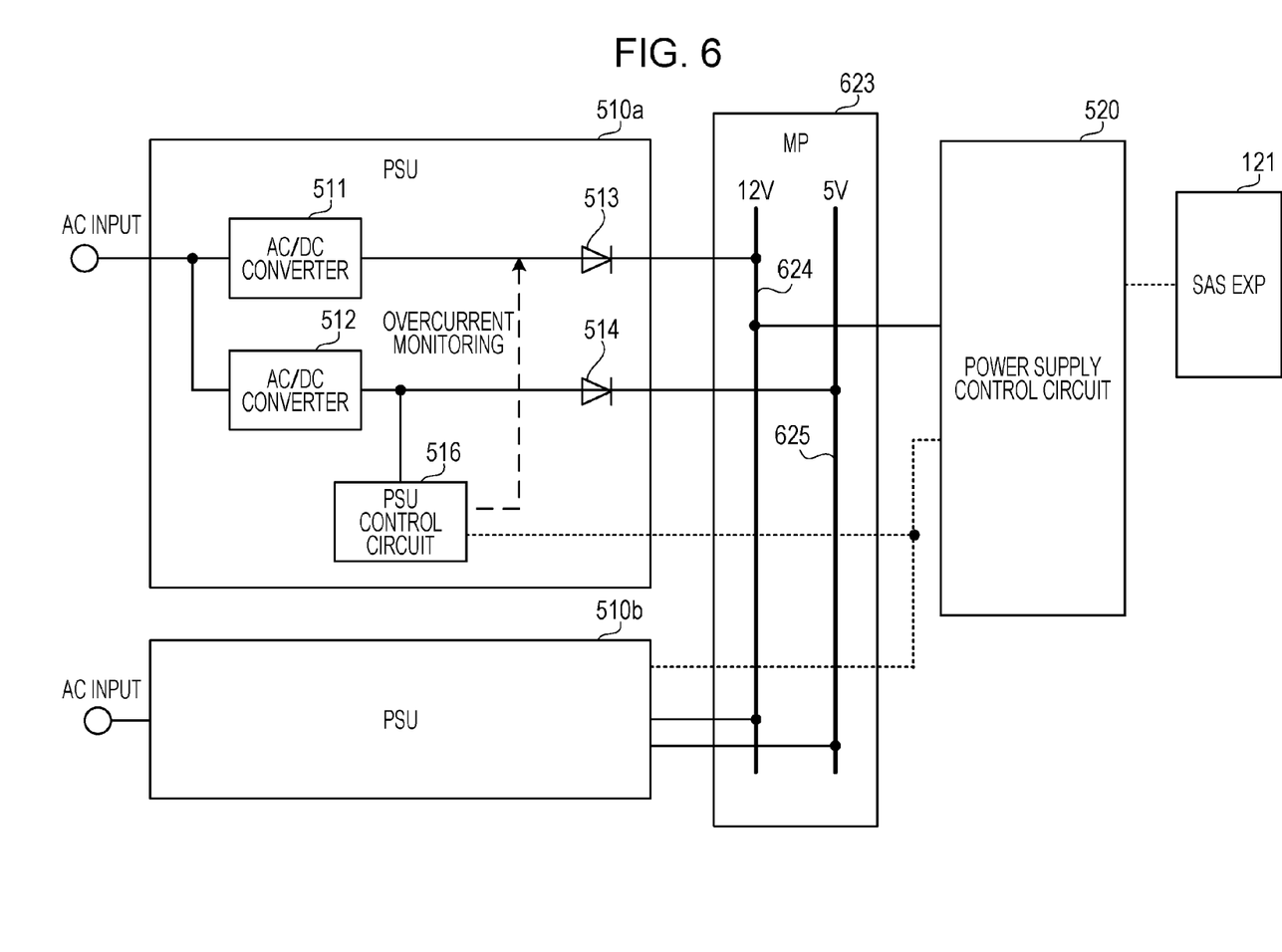
FIG. 6 is a diagram illustrating a comparative example of the power supply device.

Here, FIG. 6 is a diagram illustrating a comparative example of the power supply device. In FIG. 6, an MP 623, PSUs 510a and 510b, and a power supply control circuit 520 respectively correspond to the MP 123, the PSUs 210a and 210b, and the power supply control circuit 220 in FIG. 5. In addition, AC/DC converters 511 and 512, diodes 513 and 514, and a PSU control circuit 516 in the PSU 510a respectively correspond to the AC/DC converters 211 and 212, the diodes 213 and 214, and the PSU control circuit 216 in FIG. 5. In addition, power supply lines 624 and 625 in FIG. 6 respectively correspond to the power supply lines 124 and 125 in FIG. 5.

That is, in the PSU 510a, the AC/DC converter 511 generates 12V power supply voltage, and outputs the generated voltage to the power supply line 624 of the MP 623 through the diode 513. In addition, the AC/DC converter 512 generates 5V power supply voltage, and outputs the generated voltage to the power supply line 625 of the MP 623 through the diode 514.

The PSU control circuit 516 is operated using the 5V power supply voltage from the AC/DC converter 512. The PSU control circuit 516 monitors occurrence of overcurrent in a power supply line between the AC/DC converter 511 and the diode 513. However, differently from the PSU control circuit 216 in FIG. 5, it is assumed that the PSU control circuit 516 does not include a function to detect the direction of current.

The PSU 510b also has a configuration similar to that of the PSU 510a. On the other hand, the power supply control circuit 520 is operated only using 12V power supply voltage, differently from the power supply control circuit 220 in FIG. 5. The power supply control circuit 520 may receive a detection signal indicating that occurrence of overcurrent has been detected, from each of the PSU control circuits 516 of the PSUs 510a and 510b. The power supply control circuit 520 transmits information indicating the occurrence of the overcurrent to the host device through the SAS expander 121, based on the received detection signal.

In the case of the configuration in FIG. 6, the power supply control circuit 520 may identify a PSU in which overcurrent has been detected, from among the PSUs 510a and 510b. However, an electric short-circuit that causes the overcurrent may occur even inside the PSU or on a power supply line that is in the vicinity of the load as compared with the PSU. Therefore, it is difficult for the power supply control circuit 520 to identify the occurrence location of the electric short-circuit that causes the overcurrent. Thus, it is desirable that the administrator investigates the location at the electric short-circuit has occurred, so that there is a problem that it takes a time for a recovery work such as replacement of the device in which the failure has occurred.

In addition, in the case of the configuration in FIG. 6, when overcurrent has been detected in both of the PSUs 510a and 510b, the operations of the AC/DC converters 511 in both of the PSUs 510a and 510b are stopped, and output of the 12V power supply voltage is stopped. At this time, the power supply control circuit 520 that has been operated using the 12V power supply voltage is stopped, thereby causing a problem that it is difficult to notify the host device of information indicating that the overcurrent has been detected.

A power supply device 200 according to a second embodiment is used to solve such a problem as follows. The description is made below with reference to FIG. 5. Each of the PSU control circuits 216 in both of the PSUs 210a and 210b detects the direction of current when overcurrent has occurred, and transmits overcurrent detection notification including information on the detected direction of the current, to the power supply control circuit 220. When the direction of the current is a direction from the MP 123 to the PSU, the power supply control circuit 220 may determine that an electric short-circuit has occurred inside the PSU. On the other hand, when the direction of the current is a direction from the PSU to the MP 123, the power supply control circuit 220 may determine that an electric short-circuit has occurred in the vicinity of the load as compared with the PSU. In the embodiment, in the latter case, the power supply control circuit 220 determines that an electric short-circuit has occurred in the MP 123.

As a result, the power supply control circuit 220 may notify the CM 110 of information on the PSU 210a, the PSU 210b, or the MP 123 in which an electric short-circuit has occurred. The notified information is displayed, for example, on the display device 61 of the management terminal 60, and visually recognized by the administrator. The administrator recognizes the device in which the failure has occurred from the notified information, without investigation, to replace the device in which the failure has occurred. Thus, a work time from the failure to the recovery of the device is reduced, and the work efficiency is improved.

In addition, the power supply control circuit 220 includes the controller 222 operated using 5V power supply voltage, in addition to the controller 221 operated using 12V power supply voltage. When overcurrent is detected in both of the PSUs 210a and 210b, the operations of the AC/DC converters 211 in both of the PSUs 210a and 210b are stopped, and the output of the 12V power supply voltage is stopped. However, even in this case, the controller 222 of the power supply control circuit 220 is operated using 5V power supply voltage, and may receive overcurrent detection notification from each of the PSU control circuits 216 of the PSUs 210a and 210b.

However, differently from the controller 221, the controller 222 does not include a function to communicate with the host device (CM 110). As a result, power consumption of the controller 222 becomes smaller than that of the controller 221, and the controller 222 may be operated using 5V power supply voltage.

When the controller 222 has received overcurrent detection notification, it is difficult for the controller 222 to transmit information on the location at the failure has occurred, to the CM 110. Therefore, the controller 222 causes the display panel 230 operated using 5V power supply voltage to display the location at which the failure has occurred. When overcurrent detection notification is transmitted from both of the PSUs 210a and 210b, it is estimated that the location at which the failure has occurred exists in the MP 123, so that the controller 222 causes the display panel 230 to display information indicating that a failure has occurred in the MP 123. As a result, the administrator may be caused to recognize the occurrence of the failure in the MP 123.

Figure 7:
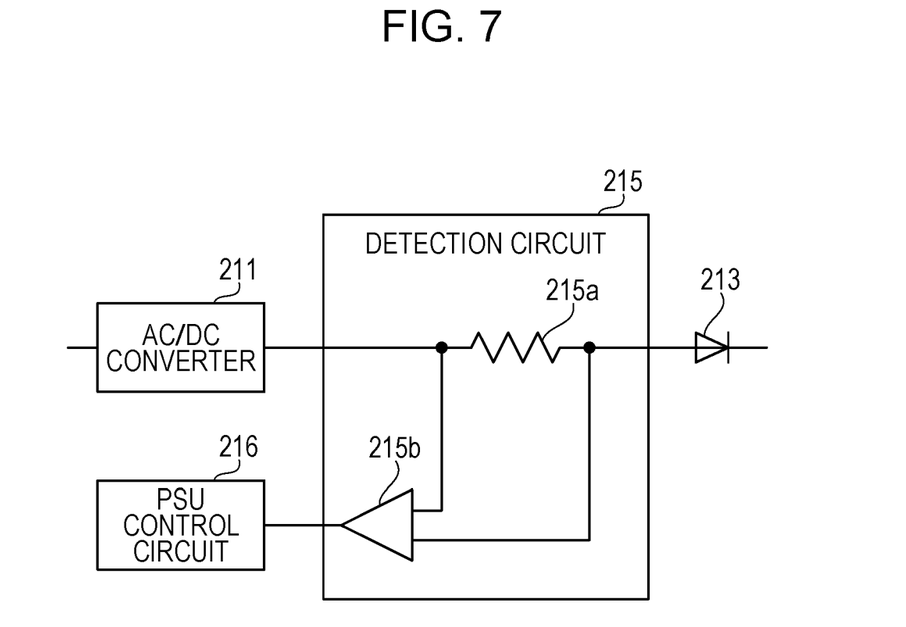
FIG. 7 is a diagram illustrating an internal configuration example of a detection circuit of a PSU.

FIG. 7 is a diagram illustrating an internal configuration example of the detection circuit of the PSU. The detection circuit 215 includes a resistor 215a and an amplifier circuit 215b. The resistor 215a is located on a power supply line between the AC/DC converter 211 and the diode 213. To the input terminal of the amplifier circuit 215b, voltage at one end of the resistor 215a and voltage at the other end of the resistor 215a are input. The amplifier circuit 215b amplifies a difference between the voltage at one end of the resistor 215a and the voltage at the other end of the resistor 215a, and outputs the difference to the PSU control circuit 216. The amplifier circuit 215b is obtained, for example, by an operational amplifier.

The PSU control circuit 216 determines whether overcurrent has occurred and determines whether specified value exceedance has occurred, by comparing a voltage level of the signal that has been input from the amplifier circuit 215b, with the threshold values Th1 and Th2 stored in the memory 217. In addition, the PSU control circuit 216 determines the direction of current that flows through the resistor 215a, from the polarity (positive or negative) of the voltage level of the signal input from the amplifier circuit 215b.

It is desirable that the resistor 215a is located in the vicinity of the diode 213 on the power supply line between the AC/DC converter 211 and the diode 213. As a result, a probability may be reduced that an electric short-circuit occurs between a detection point of overcurrent (that is, the position of the resistor 215a) and the output end of the PSU 210a on the above-described power supply line. Thus, the accuracy of determination whether the location at which the electric short-circuit has occurred is inside the PSU 210a may be improved.

Figure 8:
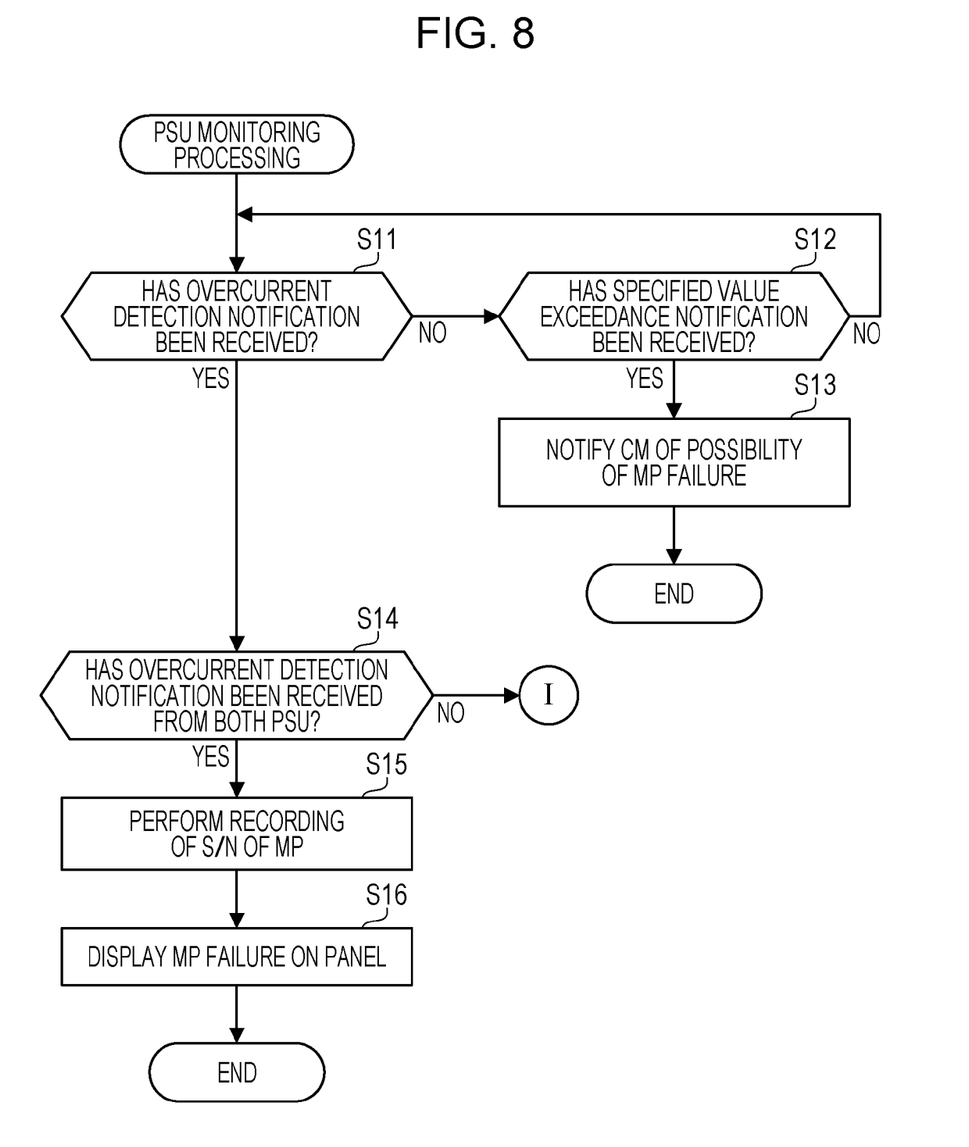
FIG. 8 is a flowchart illustrating a monitoring processing example of the PSU by a power supply control circuit.
Figure 9:
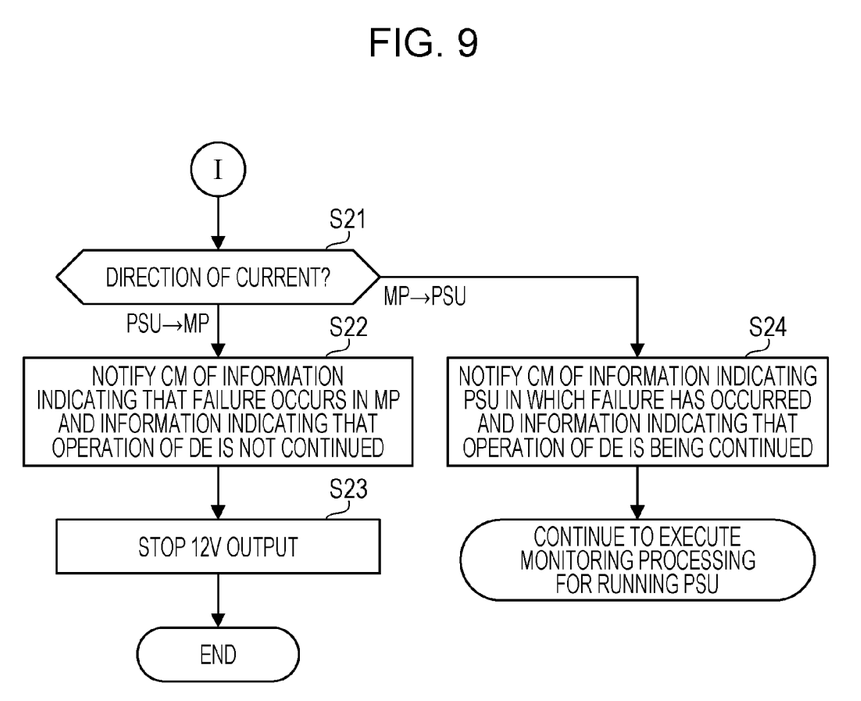
FIG. 9 is the flowchart illustrating the monitoring processing example of the PSU by the power supply control circuit.

The processing of the power supply device 200 is described below with reference to flowcharts. FIGS. 8 and 9 correspond to the flowcharts illustrating a monitoring processing example of the PSU by the power supply control circuit. [Step S11] The power supply control circuit 220 monitors overcurrent detection notification from the PSUs 210a and/or 210b. When the overcurrent detection notification has been received, the processing of Step S14 is executed, and when the overcurrent detection notification is not received, the processing of Step S12 is executed.

[Step S12] The power supply control circuit 220 monitors specified value exceedance notification from the PSUs 210a and/or 210b. When the specified value exceedance notification has been received, the processing of Step S13 is executed, and when the specified value exceedance notification is not received, the processing of Step S11 is executed.

The above-described pieces of processing Steps S11 and S12 are repeated at regular time intervals until the power supply control circuit 220 receives one of the overcurrent detection notification and the specified value exceedance notification. [Step S13] The controller that has received the specified value exceedance notification transmits notification information indicating that it is probable that a failure has occurred in the MP 123, to the CM 110 through the SAS expander 121. The CM 110 transfers the received notification information to the management terminal 60. The management terminal 60 causes the display device 61 to display information indicating that it is probable that the failure has occurred in the MP 123, based on the received notification information.

[Step S14] It is determined whether the overcurrent detection notification has been received from both of the PSUs 210a and 210b. When the overcurrent detection notification has been received from both of the PSUs 210a and 210b, the processing of Step S15 is executed, and when the overcurrent detection notification has been received only from one of the PSUs 210a and 210b, the processing of Step S21 is executed.

[Step S15] When the overcurrent detection notification has been output from both of the PSUs 210a and 210b, the output of 12V power supply voltage is stopped in both of the PSUs 210a and 210b. In this case, the controller 222 receives the overcurrent detection notification from both of the PSUs 210a and 210b. The controller 222 reads a serial number (S/N) from the memory of the MP 123, and records the serial number (S/N) to the serial number area 223a of the memory 223.

[Step S16] The controller 222 causes the display panel 230 to display information indicating that a failure has occurred in the MP 123. When the administrator browses the information that has been displayed on the display panel 230, and recognizes that the failure has occurred in the MP 123, the administrator performs an operation in which the DE 120 is shut down in order to replace the MP 123. In addition, the administrator starts the DE 120 again after the administrator has replaced the MP 123 in which the failure has occurred with a new MP 123. The processing after the start of the DE 120 is described with reference to FIGS. 10A and 10B.

[Step S21] When overcurrent detection notification has been output from one of the PSUs 210a and 210b, the output of 12V power supply voltage from the other PSU is continued, so that the operation of the controller 221 is also continued. The controller 221 that has received the overcurrent detection notification from the one PSU 210 recognizes the direction of current based on the received overcurrent detection notification, and determines processing that is to be executed next in accordance with the recognized direction. When the direction of the current is a direction from the PSU to the MP 123, the processing of Step S22 is executed. When the direction of the current is a direction from the MP 123 to the PSU, the processing of Step S24 is executed.

[Step S22] The controller 221 transmits notification information indicating that the location at which the failure has occurred exists in the MP 123, and that it is difficult to continue the operation of the DE 120, to the CM 110 through the SAS expander 121. It is difficult to continue the operation of the DE 120 because it is desirable that the other PSU in which overcurrent is not detected is also stopped, and supply of 12V power supply voltage is stopped for safety when the location at which the failure has occurred exists in the MP 123.

The CM 110 transfers the received notification information to the management terminal 60. On the management terminal 60, information indicating that the location at the failure has occurred exists in the MP 123 and that it is difficult to continue the operation of the DE 120 is displayed, based on the received notification information.

[Step S23] The controller 221 instructs the PSU control circuit 216 that has not output overcurrent detection notification to stop the supply of 12V power supply voltage, from among the PSUs 210a and 210b. The PSU control circuit 216 that has received the instruction stops the operation of the AC/DC converter 211 in the PSU. As a result, supply of the 12V power supply voltage is stopped, and the operation of the controller 221 is stopped.

[Step S24] The controller 221 transmits information used to identify a PSU in which a failure has occurred and notification information indicating that the DE 120 is running, to the CM 110 through the SAS expander 121. The CM 110 transfers the received notification information to the management terminal 60. On the management terminal 60, information indicating that the failure has occurred, identification information on a PSU in which the failure has occurred, and information indicating that the operation of the DE 120 is being continued are displayed, based on the received notification information.

After that, due to the 12V power supply voltage supplied from the PSU in which a failure does not occur, the operation of the DE 120 is continued, and the monitoring processing of the PSU by the power supply control circuit 220 is continued. In the processing of FIG. 9, as an example, whether the operation of the DE 120 is being continued or whether it is difficult to continue the operation of the DE 120 is determined by the controller 221, and the determination result is notified to the CM 110 using the notification information. However, such determination may be performed by the CM 110 or the management terminal 60. In this case, in Step S22, information indicating that the location at which the failure has occurred exists in the MP 123 may be notified to the CM 110, and in Step S24, information used to identify a PSU in which a failure has occurred may be notified to the CM 110.

Figure 10A:
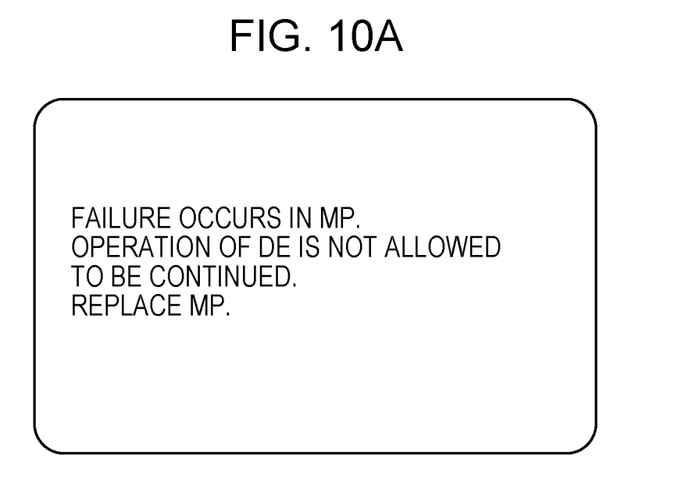
FIGS. 10A and 10B are diagrams illustrating display examples of screens displayed based on notification information.
Figure 10B:
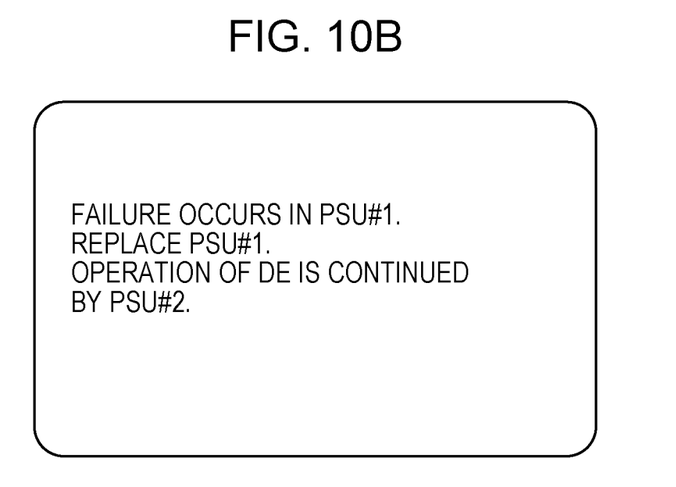

FIGS. 10A and 10B are diagrams illustrating display examples of screens displayed based on notification information. FIGS. 10A and 10B are diagrams illustrating display examples of screens displayed on the display device 61 of the management terminal 60 depending on the pieces of processing of Steps S22 and S24 in FIG. 9, respectively.

In the display example of FIG. 10A, the location at which the failure has occurred exists in the MP, and information used to facilitate replacement of the MP 123 is displayed. On the other hand, in the display example of FIG. 10B, the location at which the failure has occurred exists in a PSU #1 (PSU having an identification number "1"), and information used to facilitate replacement of the PSU #1 is displayed. As described above, the power supply control circuit 220 may notify the administrator of information indicating whether the location at which a failure has occurred exists in the PSU or the MP 123. In addition, when a failure has occurred in a PSU, the power supply control circuit 220 may notify the administrator of information indicating the PSU in which the failure has occurred.

In addition, in the display example of FIG. 10A, information indicating that it is difficult to continue the operation of the DE 120 is displayed. This is why it is difficult to continue the operation of the DE 120 because supply of the 12V power supply voltage is stopped when a failure has occurred in the MP 123. On the other hand, in the display example of FIG. 10B, information indicating that the operation of the DE 120 is continued in spite of occurrence of the failure is displayed. This is why the operation of the DE 120 may be continued because 12V power supply voltage is supplied from one of the PSUs even when a failure has occurred in the other PSU. As described above, the power supply control circuit 220 may notify the administrator of the operation state of the DE 120 in addition to information indicating the location at which the failure has occurred.

Figure 11:
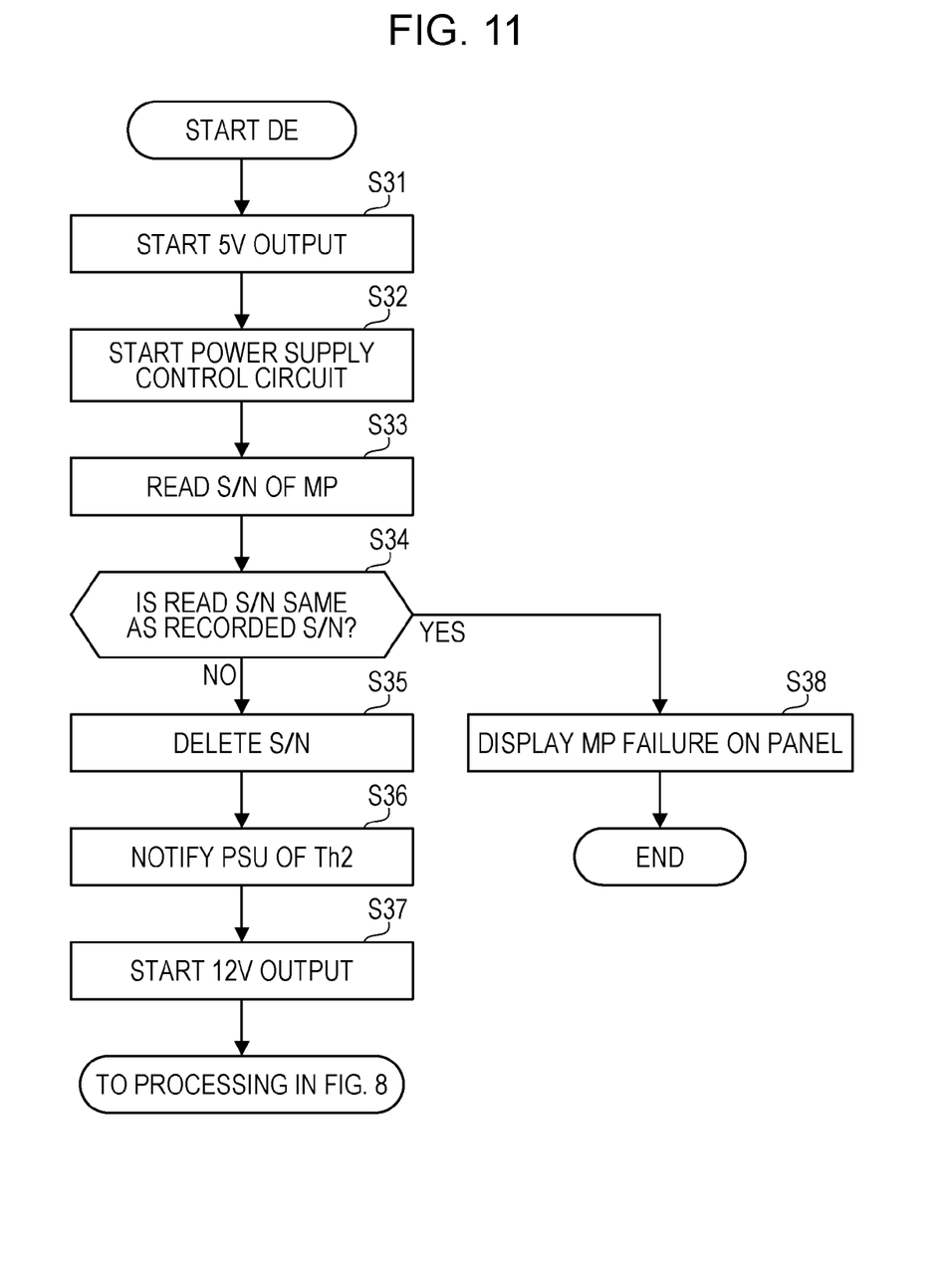
FIG. 11 is a flowchart illustrating a processing example at the time of start of the DE.

FIG. 11 is a flowchart illustrating a processing example at the time of start of the DE. [Step S31] When the DE 120 is started in response to an operation of the administrator, output of 5V power supply voltage from the AC/DC converters 212 of the PSUs 210a and 210b is started.

[Step S32] The controller 222 of the power supply control circuit 220 is started. [Step S33] The controller 222 reads a serial number from the memory 126 of the MP 123 that is currently installed in the DE 120.

[Step S34] The controller 222 compares the read serial number with a serial number that has been recorded to the serial number area 223a of the memory 223. When the serial numbers match, the processing of Step S38 is executed. When the serial numbers are different, the processing of Step S35 is executed. Even when a serial number is not recorded to the serial number area 223a of the memory 223, the processing of Step S35 is executed.

[Step S35] The controller 222 deletes a serial number that has been recorded to the serial number area 223a of the memory 223. [Step S36] The controller 222 calculates the threshold value Th2 in accordance with the following procedure. The controller 222 recognizes the models of devices that are currently installed in the DE 120. For example, the controller 222 recognizes the models of an HDD and an SAS expander that are installed in the DE 120. The controller 222 reads information on rated current corresponding to each of the recognized models, from the rated current list of the memory 223, and calculates the threshold value Th2 based on the read rated current. For example, the controller 222 calculates the threshold value Th2 using "{(the total read rated current)/(number of installed PSUs)}×coefficient". The coefficient is a number of 1 or more and less than 2, and is, for example, "1.1". The coefficient is a value used to determine occurrence of specified value exceedance by the amount of output current as compared with current output by a single PSU in a state in which all recognized devices consume the maximum electric power.

The controller 222 notifies the PSU control circuit 216 in each of the PSUs 210a and 210b of the calculated threshold value Th2. Each of the PSU control circuits 216 updates the threshold value Th2 stored in the memory 217 by the notified threshold value Th2.

[Step S37] The controller 222 instructs the PSU control circuits 216 of the PSUs 210a and 210b to start output of 12V power supply voltage. Each of the PSU control circuits 216 starts the operation of the AC/DC converter 211, and causes the AC/DC converter 211 to start output of 12V power supply voltage. As a result, the controller 221 is started, and the start processing of the DE 120 is continued. The PSU monitoring processing described above with reference to FIG. 8 is executed after that.

[Step S38] The controller 222 causes the display panel 230 to display information indicating that a failure has occurred in the MP 123. In this time, the controller 222 avoids that the start processing of the DE 120 is continued without instructing the PSU control circuits 216 of the PSUs 210a and 210b to start output of 12V power supply voltage.

As described above with reference to FIG. 8, when overcurrent has been detected in both of the PSUs 210a and 210b, the detection of the overcurrent is not notified to the CM 110, so that a serial number of the MP 123 in which the failure has occurred is recorded to the serial number area 223a of the memory 223 (Step S15). After that, when the DE 120 is restarted, as illustrated in FIG. 11, the serial number of the installed MP 123 is compared with the serial number that has been recorded to the serial number area 223a. As a result, it is determined that the MP 123 in which the failure has occurred is replaced with a new MP 123. When the serial numbers are different, it is determined that the MP 123 has been replaced, and the start processing of the DE 120 is continued. However, when the serial numbers match, it is determined that the MP 123 is not replaced. In this case, the start processing of the DE 120 is not continued, and it is avoided that 12V power supply voltage flows through the MP 123 in which the failure has occurred, and that a further failure occurs.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. An electronic apparatus comprising:
a load;
a power supply circuit that supplies power supply voltage to the load;
an overcurrent detection circuit that performs output of detection information indicating the direction of current at a power supply path for the load in the power supply circuit when overcurrent occurs in the power supply path; and
a determination circuit that performs output of notification information indicating whether or not a location at which a failure occurs exists in the power supply circuit, based on the detection information, wherein
the electronic apparatus includes a plurality of the power supply circuits each having the overcurrent detection circuit, respectively; and
when the determination circuit receives the detection information from one of the plurality of overcurrent detection circuits, the determination circuit outputs, as the notification information, one of first notification information including information identifying a power supply circuit corresponding to the one overcurrent detection circuit from among the plurality of power supply circuits as the location at which the failure occurs and second notification information indicating that the location at which the failure occurs, exists in the vicinity of the load as compared with the plurality of power supply circuits, depending on the direction of the current, which is indicated by the detection information received from the one overcurrent detection circuit.

2. The electronic apparatus according to claim 1, wherein the first notification information further indicates that an operation of the load is allowed to be continued, and the second notification information further indicates that the operation of the load is not allowed to be continued.

3. The electronic apparatus according to claim 2 further comprising:
a display device, wherein
each of the plurality of power supply circuits supplies, in addition to the power supply voltage to the load, standby power supply voltage that is lower than the power supply voltage supplied to the load, to the determination circuit;
the notification information is transmitted to a further apparatus that exists outside the electronic apparatus when the determination circuit is operated using the power supply voltage supplied to the load; and
the determination circuit is operated using the standby power supply voltage, and causes the display device to display information indicating that the failure occurs, instead of output of the notification information when the determination circuit receives the detection information from all of the plurality of overcurrent detection circuits.

4. The electronic apparatus according to claim 3 further comprising:
a nonvolatile storage device; and
a transmission path substrate in which a transmission line of the power supply voltage supplied from the plurality of power supply circuits to the load is provided, wherein
the determination circuit further records an identification number assigned to the transmission path substrate currently being installed in the electronic apparatus, to the nonvolatile storage device when the determination circuit receives the detection information from all of the plurality of overcurrent detection circuits; and
the determination circuit is operated using the standby power supply voltage when the electronic apparatus is started from a shut-down state, and reads an identification number assigned to the transmission path substrate being currently installed in the electronic apparatus from the transmission path substrate, and avoids start of supply of the power supply voltage from the plurality of power supply circuits to the load when the read identification number is matched with the identification number stored in the nonvolatile storage device.

5. A power supply device comprising:

a power supply circuit that supplies power supply voltage to a load;

an overcurrent detection circuit that performs output of detection information indicating the direction of current at a power supply path for the load in the power supply circuit when overcurrent occurs in the power supply path; and a determination circuit that performs output of notification information indicating whether or not a location at which a failure occurs exists in the power supply circuit, based on the detection information, wherein the power supply device includes a plurality of the power supply circuits each having the overcurrent detection circuit, respectively; and when the determination circuit receives the detection information from one of the plurality of overcurrent detection circuits, the determination circuit outputs, as the notification information, one of first notification information including information identifying a power supply circuit corresponding to the one overcurrent detection circuit from among the plurality of power supply circuits as the location at which the failure occurs and second notification information indicating that the location at which the failure occurs, exists in the vicinity of the load as compared with the plurality of power supply circuits, depending on the direction of the current, which is indicated by the detection information received from the one overcurrent detection circuit.

6. A power supply monitoring method for monitoring a power supply in an electronic apparatus including a power supply circuit that supplies power supply voltage to a load, the power supply monitoring method comprising:

performing output of detection information indicating the direction of current at a power supply path for the load in the power supply circuit, by an overcurrent detection circuit included in the electronic apparatus when it is detected that overcurrent occurs in the power supply path; and performing output of notification information indicating whether or not a location at which a failure occurs exists in the power supply circuit, based on the detection information, by a determination circuit included in the electronic apparatus, wherein the electronic apparatus includes a plurality of power supply circuits each having the overcurrent detection circuit, respectively; and when the detection information is output from one of the plurality of overcurrent detection circuits, the determination circuit outputs, as the notification information, one of first notification information including information indicating a power supply circuit corresponding to the one overcurrent detection circuit from among the plurality of power supply circuits as the location at which the failure occurs and second notification information indicating that the location at which the failure occurs exists in the vicinity of the load as compared with the plurality of power supply circuits, depending on the direction of the current, which is indicated by the detection information output from the one overcurrent detection circuit.

7. The power supply monitoring method according to claim 6, wherein the first notification information further indicates that an operation of the load is allowed to be continued, and the second notification information further indicates that the operation of the load is not allowed to be continued.

8. The power supply monitoring method according to claim 7, wherein each of the plurality of power supply circuits supplies, in addition to the power supply voltage, a standby power supply voltage that is lower than the power supply voltage supplied to the load, to the determination circuit;

the notification information is transmitted to a further apparatus that exists outside the electronic apparatus when the determination circuit is operated using the power supply voltage supplied to the load; and the determination circuit is operated using the standby power supply voltage, and causes a display device included in the electronic apparatus to display information indicating that the failure occurs, instead of output of the notification information when the detection information is output from all of the plurality of overcurrent detection circuits.

9. The power supply monitoring method according to claim 8 further comprising:

a nonvolatile storage device; and a transmission path substrate in which a transmission line of the power supply voltage supplied from the plurality of power supply circuits to the load is provided, wherein the determination circuit further records an identification number assigned to the transmission path substrate being currently installed in the electronic apparatus, to the nonvolatile storage device when the detection information is output from all of the plurality of overcurrent detection circuits; and the determination circuit is operated using the standby power supply voltage when the electronic apparatus is started from a shut-down state, and reads an identification number assigned to the transmission path substrate being currently installed in the electronic apparatus from the transmission path substrate, and avoids start of supply of the power supply voltage from the plurality of power supply circuits to the load when the read identification number is matched with the identification number stored in the nonvolatile storage device.

* * * * *